United States Patent [19]  
Weinberg

[11] Patent Number: 4,535,349  
[45] Date of Patent: Aug. 13, 1985

[54] NON-VOLATILE MEMORY CELL USING A CRYSTALLINE STORAGE ELEMENT WITH CAPACITIVELY COUPLED SENSING

[75] Inventor: Zeev A. Weinberg, White Plains, N.Y.

[73] Assignee: International Business Machines Corporation, Armonk, N.Y.

[21] Appl. No.: 336,477

[22] Filed: Dec. 31, 1981

[51] Int. Cl.³ .................... H01L 29/78; G11C 11/40
[52] U.S. Cl. .................. 357/23.6; 357/23.5; 357/4; 357/6; 365/149
[58] Field of Search ........ 357/51, 58, 23 C, 4, 23 VT, 357/24 M; 365/149

[56] References Cited

U.S. PATENT DOCUMENTS

| | | | |
|---|---|---|---|
| 3,700,932 | 10/1972 | Kahng | 357/24 M |
| 3,858,232 | 12/1974 | Boyle et al. | 357/23 R |
| 3,859,642 | 1/1975 | Mar | 357/45 |
| 3,896,484 | 7/1975 | Nishizawa et al. | 357/24 M |
| 3,972,059 | 7/1976 | DiStefano | 357/54 X |
| 4,021,788 | 5/1977 | Marr | 357/51 X |
| 4,099,196 | 7/1978 | Simko | 357/23 |
| 4,115,914 | 9/1978 | Harari | 357/59 X |
| 4,143,393 | 3/1979 | DiMaria et al. | 357/52 |
| 4,163,243 | 7/1979 | Kamins et al. | 357/41 |
| 4,164,751 | 8/1979 | Tasch | 357/41 |
| 4,217,601 | 8/1980 | DeKeersmaecker | 357/54 |
| 4,242,736 | 12/1980 | Raffel et al. | 357/23 VT |
| 4,247,916 | 1/1981 | Erb | 357/23 C |
| 4,250,569 | 2/1981 | Sasaki et al. | 357/23 VT |
| 4,302,764 | 11/1981 | Fang et al. | 357/23 C |
| 4,334,292 | 6/1982 | Kotecha | 365/185 X |
| 4,371,955 | 2/1983 | Sasaki | 357/23 C |

FOREIGN PATENT DOCUMENTS 1460267 11/1966 France .................. 352/52 T

OTHER PUBLICATIONS

Muller, "Pin Diodes . . . ", IEEE Trans. on Electron Devices, vol. ED 23, No. 1, Jan. 1976, pp. 61-63.
Imabun, Electrical Engineering in Japan, vol. 93, No. 3, (May-Jun. 1973), pp. 123-128.
Helmcke, Arch. Elektron. / bertragungstech., Band 26, Heft 9, 1972, pp. 409-411 (Kurzberichte).
DiMaria et al., "Electrically Alterable Read-Only-Memory Using Si-Rich $SiO_2$ Injectors and a Floating Polycrystalline Silicon Storage Layer", J. Appl. Phys., vol. 52, No. 7, pp. 4825-4842, Jul. 1981.
DiMaria, D. J., "Insulator Physics and Engineering: Electrically-Alterable Read-Only-Memory Applications", J. de Physique, vol. 42, No. 10, Oct. 1981, pp. 1115-1121.

Primary Examiner—William D. Larkins
Attorney, Agent, or Firm—Thomas J. Kilgannon

[57] ABSTRACT

The present invention relates to storage devices which utilize a floating single crystal electrode onto which elcetrons are injected to vary the capacitance of a device which includes capacitance contributions from a pair of insulator regions and that resulting from the uncharged floating single crystal electrode. The memory cell includes at least a pair of other electrodes one of which is utilized to provide two voltage levels to cause injection of electrons and provide an interrogation or read pulse. The other of the pair is utilized as a sense electrode which capacitively sense current when a read pulse is applied to the device via a control electrode. A second embodiment utilizes a pair of injector electrodes, a separate control electrode and a sense electrode in addition to the single crystal floating electrode. A memory array incorporating a device using the single crystal floating electrode is also disclosed.

4 Claims, 5 Drawing Figures

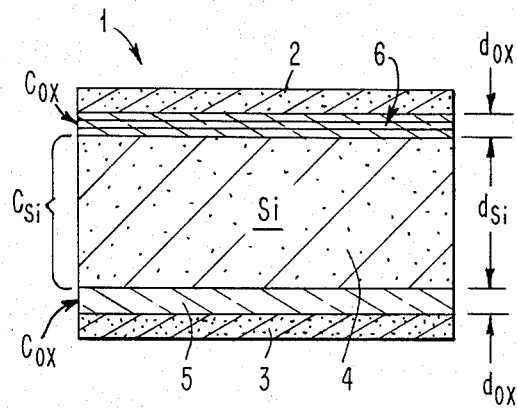
FIG. 1
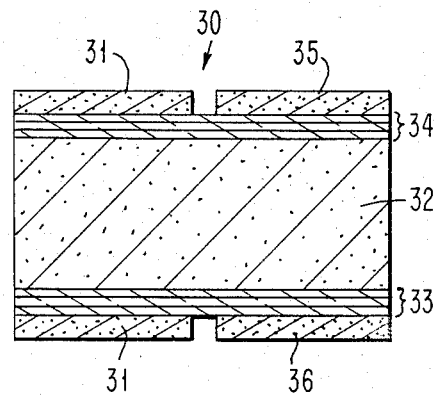
FIG. 3
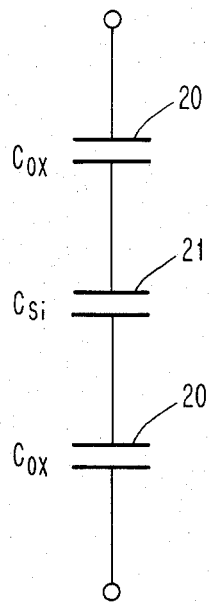
FIG. 2.1
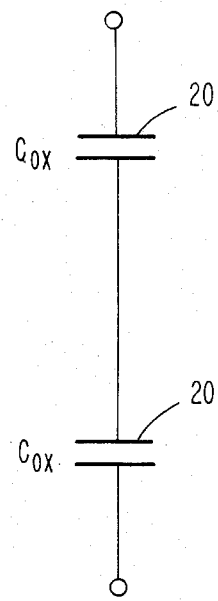
FIG. 2.2

1

NON-VOLATILE MEMORY CELL USING A CRYSTALLINE STORAGE ELEMENT WITH CAPACITIVELY COUPLED SENSING

DESCRIPTION

Technical Field

This invention relates generally to memory cells which store information in digital form and more particularly, relates to a non-volatile storage device wherein information is stored on a crystalline semiconductor floating electrode and wherein the information is read solely by capacitive coupling. The storage device incorporates injection, control and sense electrodes and can be fabricated as a high density, low power array using conventional semiconductor fabrication techniques.

BACKGROUND ART

U.S. Pat. No. 4,099,196 shows an electrically alterable PROM which incorporates a floating polysilicon gate and a programming gate in the metal-oxide-semiconductor (MOS) environment. The floating gate is either positively (lack of electrons) charged or negatively charged to provide threshold voltages of approximately $-10$ V and $10$ V, respectively, for the MOS device.

Similarly, U.S. Pat. No. 4,164,751 shows an MOS memory cell device wherein an oxide capacitance and a depletion capacitance are obtained, in the instance of the former, by the interaction of an electrode with the surface of a substrate and, in the instance of the latter due to the interaction of double ion implantations within the substrate.

U.S. Pat. No. 4,163,243 shows a one device memory cell arrangement wherein the depletion layer capacitance is increased by locally enhancing the substrate dopant concentration.

U.S. Pat. No. 4,217,601 shows a field effect transistor memory cell which incorporates a trapping layer into which electrons are injected to control current flow between the source and drain of the associated field effect transistor.

None of the above described devices uses a floating electrode to vary the effective capacitance of a structure from one effective capacitance when no electrons are present on it to a different effective capacitance when electrons are present on the floating electrode. Some prior art structures use capacitors of a fixed character to store charge and to move about by means of an associated FET. Other prior structures store injected charge at interfaces to influence the conduction or non-conduction of an associated transistor. Indeed, none of the prior art patents teach or suggest that the rather complex memory cells of the prior art which include field effect transistors and the like can be considerably simplified by invoking the varying capacitance effect provided by the structures of the present invention.

It is, therefore, an object of the present invention to provide a simplified memory cell or storage device which requires no transistors within the memory cell itself.

It is another object of the present invention to provide a memory cell in which the injection of electrons onto a single crystal floating electrode changes the capacitance of the structure from the capacitance it had when no electrons are present.

A further object of the present invention is to provide a memory cell wherein the state of the memory cell is sensed capacitively.

BRIEF SUMMARY OF THE INVENTION

The present invention relates to storage devices which utilize a floating single crystal electrode onto which electrons are injected to vary the capacitance of a device which includes capacitance contributions from a pair of insulator regions and that resulting from the uncharged floating single crystal electrode. The memory cell includes at least a pair of other electrodes one of which is utilized to provide two voltage levels to cause injection of electrons and provide an interrogation or read pulse. The other of the pair is utilized as a sense electrode which capacitively senses current when a read pulse is applied to the device via a control electrode. A second embodiment utilizes a pair of injector electrodes, a separate control electrode and a sense electrode in addition to the single crystal floating electrode. A memory array incorporating a device using the single crystal floating electrode is also disclosed.

These and other objects, features and advantages will be more apparent from the following more particular description of the preferred embodiments.

BRIEF DESCRIPTION OF THE DRAWINGS

FIG. 1 is a cross-sectional view of a memory cell or storage device showing a combined injector and control electrode and a sense electrode disposed in insulating spaced relationship with a floating electrode.

FIGS. 2.1, 2.2 show schematic diagrams of a pair of serially arranged capacitors which are representative of the two distinct states which the device of FIG. 1 assumes when appropriate potentials are applied to it.

FIG. 3 is a cross-sectional view of an embodiment which operates in the same manner as the device of FIG. 1 except that the injector and control electrode are formed into separate electrodes rather than the single composite electrode shown in FIG. 1.

DESCRIPTION OF PREFERRED EMBODIMENTS

Figure 4:
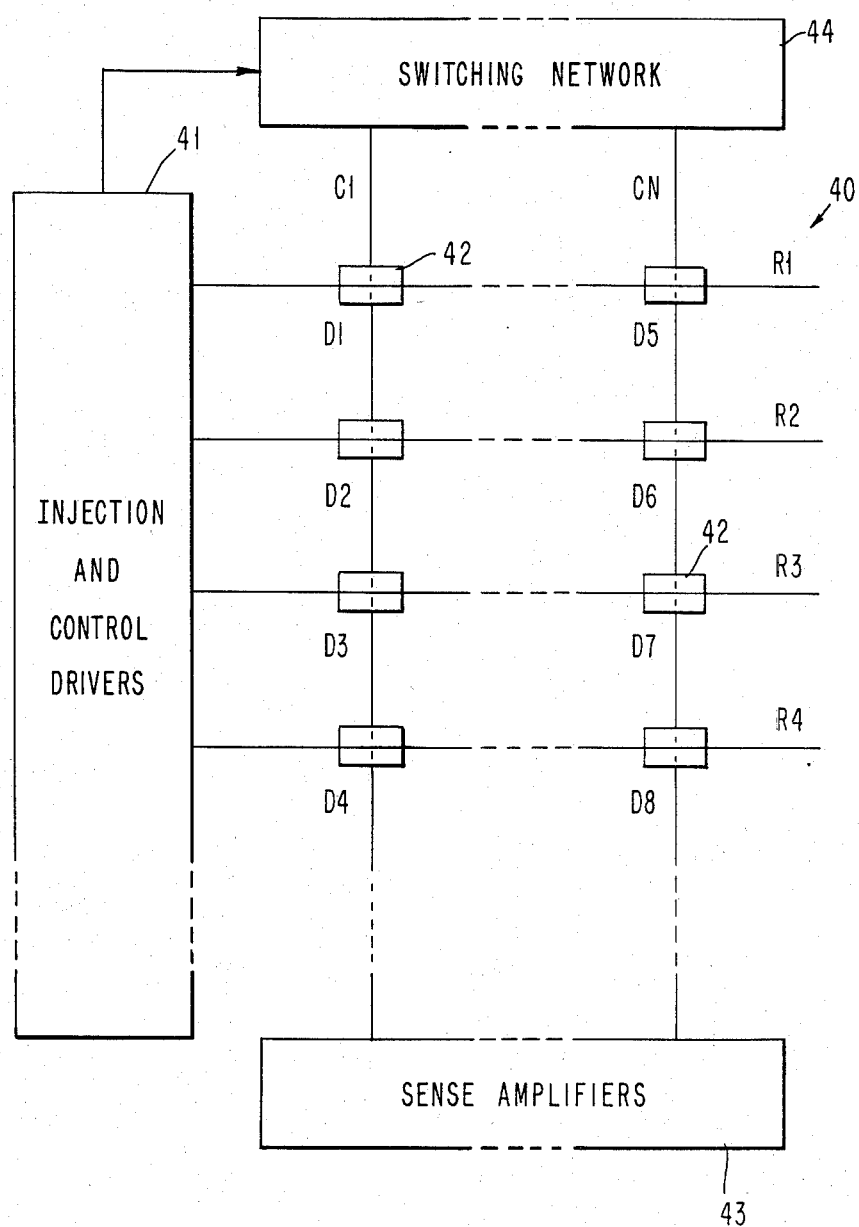
FIG. 4 is a schematic drawing of a bit oriented random access memory of memory cells using the storage devices of either FIGS. 1 or 3.

In FIG. 1, there is shown a cross-sectional view of a memory cell or storage device in accordance with the teaching of the present invention.

Memory cell or storage device 1 includes first and second electrodes 2,3, respectively, disposed in insulating spaced relationship with a floating electrode 4 by a pair of insulators 5,6. Electrode 2 which may be otherwise characterized as an injector and control electrode may be made of a metal such as aluminum or any other conductive material compatible with integrated circuits fabrication. Alternatively, electrode 2 may be made of polycrystalline silicon doped sufficiently to render it conductive. Insulator 5 is preferably formed from silicon dioxide and floating electrode 4 is preferably undoped, crystallized silicon. Other insulating materials such as aluminum oxide or silicon nitride may be used in place of silicon dioxide without departing from the spirit of the present invention.

In a preferred embodiment, insulator 6 is a composite of three layers which include a pair of silicon-rich, silicon dioxide layers sandwiching a layer of silicon dioxide. This three layer insulator structure is a Dual Electron Injector Structure (DEIS) which has been described in detail in an article entitled "Electrically Alterable-read-only-memory using Si-rich SiO₂ injectors and a floating polycrystalline silicon storage layer" by D. J. DiMaria et al, J. Appl. Phys. 52 (7), July 1981, p. 4825.

Electrode 3 which may be otherwise characterized as a sense electrode is preferably made of polycrystalline silicon which has been doped sufficiently to render it conductive.

Alternatively, it may be made of any conductive material which is compatible with integrated circuit fabrication.

Device 1 of FIG. 1 may be fabricated using conventional semiconductor fabrication techniques. Starting with a silicon substrate which is covered with a layer of silicon dioxide, a layer of doped silicon is deposited on the silicon dioxide layer using conventional chemical vapor deposition techniques. By suitably patterning and using conventional photolithographic masking and etching techniques, sense electrode 3 is formed along with its electrical conductors. The resulting conductive electrode is then thermally oxidized to form a layer 5 of silicon dioxide on its surface. At this juncture, a second layer of undoped silicon is chemically vapor deposited over layer 5 and over the insulated surface of the silicon substrate. The layer which results and from which floating electrode 4 is to be formed is polycrystalline in character as deposited. However, since it is desired to provide a high mobility to excess electrons, the second layer of undoped silicon should be formed into a single crystal by laser crystallization or by electron beam melting, for example. Both of these techniques are known in the semiconductor fabrication art and provide single crystals of silicon from a layer of polycrystalline silicon.

After heating to form a single crystal layer, the layer is patterned in the usual way to form floating electrode 4.

In a subsequent step, layer 6 which is a composite layer of two silicon-rich silicon dioxide layers sandwiching a layer of silicon dioxide is formed to provide a means for injecting electrons into isolated floating electrode 4. Layer 6 which may also be characterized as an injector stack has its silicon-rich silicon dioxide lower portion deposited by Chemical Vapor Deposition (CVD) such that it contains excess silicon in a range of 1–13%. Next, a layer of silicon dioxide is deposited after which a layer similar to the first mentioned silicon-rich silicon dioxide layer is deposited. The silicon richness of the layers is controlled during deposition by controlling the gaseous concentration ratio of N₂O to SiH₄ in the CVD reactor. Thus, where the ratio is 200 for deposition of a layer of pure SiO₂, it is reduced to 50 to provide an SiO₂ layer which has a 1–3% excess of silicon in it, for example.

After the deposition of composite layer 6, another layer of polycrystalline silicon is deposited from which injector and control electrode 2 is to be formed. This last layer of polycrystalline silicon is doped sufficiently to render it conductive. The polycrystalline layer is then patterned in the usual way to form electrode 2 and its associated interconnection lines.

The resulting structure as shown in FIG. 1 comprises a single crystal floating electrode 4 spaced from a pair of polycrystalline silicon electrodes 2,3 by a silicon dioxide insulator layer 5 and a composite DEIS layer 6. As fabricated, the structure can be considered as essentially three capacitors disposed in series. Two capacitors result from the presence of layers 5,6 while the third results from floating electrode 4. Under such circumstances, the capacitors provide a given effective capacitance which is a function of the dielectric constants and thicknesses of the materials involved. By injecting electrons into floating electrode 4, the capacitance contributed by this electrode is essentially shorted out by the electrons resulting in a new effective capacitance consisting of the capacitances contributed by layers 5,6. The dielectric constant of silicon is higher than SiO₂. However, since the thickness of floating electrode 4 is much greater than the thicknesses of layers 5,6, the effective capacitance of electrode 4 is much less than the capacitances of layers 5,6. Thus, when electrons are injected, a lower effective capacitance is shorted out providing an effective capacitance which is much higher than if the capacitance of electrode 4 were present.

With this as a basis for understanding, it should be clear that when the same interrogation pulse is applied via control electrode 2 to a higher capacitance and a lower capacitance, that a higher current will be provided for the higher capacitance since the current is a function of the effective capacitance multiplied by the rate of change of voltage with time or $$I = C_{eff} dv/dt$$

Referring now to FIGS. 2.1, 2.2, there is shown a pair of schematic diagrams which are representative of the two distinct states which device 1 of FIG. 1 assumes when appropriate potentials are applied to it. FIG. 2.1 represents the device of FIG. 1 when no electrons have been injected onto floating electrode 4 and FIG. 2.2 represents the device of FIG. 1 when electrons have been injected onto floating gate 4.

In FIG. 2.1, the capacitances resulting from layers 5,6 are represented by capacitors 20 otherwise identified in FIG. 2.1 by the caption $C_{ox}$. The capacitance resulting from floating electrode 4 is represented by a capacitor 21 otherwise identified in FIG. 2.1 by the caption $C_{si}$. To the extent that floating electrode 4 is undoped silicon, it is highly resistive in the absence of injected electrons.

However, when electrons are injected onto floating electrode 4 via layer 6, it becomes highly conductive due to the lateral motion of the injected electrons. FIG. 2.2 indicates that, due to the presence of electrons on floating electrode 4, capacitor 21 has been effectively shorted out leaving only the pair of capacitors 20.

When an interrogation pulse is applied to control electrode 2 of device 1 of FIG. 1 in the state represented by FIG. 2.1, a small signal is induced in sense electrode 3. However, if device 1 of FIG. 1 is in the state represented by FIG. 2.2 and an interrogation pulse is applied, electrons move back and forth between the control electrode 2 and sense electrode 3 and a larger signal is generated as previously discussed in sense electrode 3. While not specifically shown in FIGS. 2.1, 2.2, it should be appreciated that an interrogate pulse is applied across the circuits of FIGS. 2.1, 2.2 and that a high gain, operational amplifier is connected to the lower of capacitors 20 to sense the current outputs from both arrangements when the interrogate pulse is applied.

In a representative embodiment, device 1 of FIG. 1 may have the following dimensions:

Floating electrode 4 has an area of $25\mu^2$ and a thickness of $0.25\mu$. Injector and control electrode 2 and sense electrode 3 are formed from conductors having 5μ width. Layers 5,6 have thicknesses of 200 Å. To inject electrons, a voltage of −30 V is applied to electrode 2 and to eliminate or erase injected electrons, a voltage of equal magnitude but of opposite polarity is applied to electrode 2. The interrogation pulse applied to control electrode 2 typically has a magnitude of −1 volt.

Referring now to FIG. 3, there is shown therein a cross-sectional view of an embodiment which operates in the same manner as the device of FIG. 1 except that the injector and control electrodes are formed into separate electrodes rather than being the single composite electrode shown in FIG. 1 and the insulating layer utilized are both the same as layer 6 of FIG. 1.

In FIG. 3, device 30 includes a pair of injector electrodes 31 which are disposed on opposite sides of a floating electrode 32 and spaced therefrom by insulating layers 33,34. Control electrode 35 and sense electrode 36 are laterally spaced from injector electrodes 31 and disposed in insulated spaced relationship with floating electrode 32 by means of insulating layers 33,34.

Device 30 of FIG. 3 is fabricated in the same manner as device 1 of FIG. 1 except that layers 33,34 are both fabricated in the same way as layer 6 of FIG. 1. Using the double injectors permits the injection and control or interrogation functions to be separated so that separate power supplies can be utilized. In addition, injection efficiency is enhanced.

In FIG. 4, there is shown a schematic drawing of a bit oriented, random access memory array 40 of memory cells using the storage devices of FIGS. 1 or 3.

Array 40 includes a plurality of storage devices D1–D8 arranged at the intersections of orthogonally arranged columns C1–CN and rows R1–R4. Thus, device D1 is situated at the intersection of row R1 and column C1 while device D7 is situated at the intersection of row R3 and column CN. The elements identified as C1–CN and R1–R4 are, of course, made of conductive materials which interconnect devices D1–D8. Rows R1–R4 are connected to block 41 otherwise identified in FIG. 4 by the caption, Injection and Control Drivers. Drivers 41 are utilized in the writing and sensing modes of operation of array 40 to apply one voltage for injecting electrons into a selected one of the floating electrodes 42 to set the state of the selected device or memory cell and to apply a different voltage for sensing the state of a selected one of the devices or memory cells. Sensing is achieved via column C1–CN connected to block 43 which is otherwise identified in FIG. 4 by the caption, Sense Amplifier.

In operation, array 40 of FIG. 4 stores information by setting the state of memory devices D1–D8 to either a state where electrons have been injected onto an electrode 42 or electrons have not been injected onto an electrode 42.

For purposes of illustration, assume that device D1 is to have electrons injected onto its associated electrode 42 representing a binary "1" and that device D7 is to have no electrons injected onto its associated electrode 42 representing a binary "0". Considering first device D1, a relatively high potential (approximately −30V) is applied from an injection driver in block 41 to row R1 causing electrons to pass from that portion of R1 which acts as an injection electrode to the crystalline electrode 42 of device D1. To insure that electrons are injected into electrode 42 of device D1, column C1 is grounded while CN and every other column is connected to the driver potential via an output from block 44 which is otherwise identified in FIG. 4 by the caption, Switching Network. In this way, there will be no potential difference across an unselected cell, D5 for example, which could cause spurious writing of an unselected cell.

Considering device D7, since this is to have no electrons injected, if none are on its associated electrode 42, no further action need be taken to set its state. If, however, electrons are already stored on electrode 42 of device D7, a potential equal and opposite to the injecting potential must be applied to row R3 causing electrons to be extracted from electrode 42 of device D7.

Once the states of devices D1–D8 have been set, the information stored therein can be accessed by applying a potential lower (−1 V) than that applied for injecting to the selected row while simultaneously connecting the column of the selected device to the sense amplifiers of block 43 in FIG. 4 and grounding all other columns.

If device D1 is selected for sensing, a pulse having a linear rate of change of voltage with respect to time, for example, is applied to row R1 to cause the electrons stored on its associated electrode 42 to be set in motion generating a current proportional to C dv/dt in C1 which is connected to a high gain operational amplifier in block 43. To the extent that the resulting output has a given amplitude, it can be differentiated from an output which results from a device which has no electrons stored thereon by conventional means. During sensing, unselected rows are grounded to eliminate spurious coupling to unselected devices.

If device D7 is selected and connected to a sense amplifier in block 43 in FIG. 4, since it had no electrons stored thereon, when the sensing or interrogation pulse is applied the resulting output, though still a function of C dv/dt will be much lower since the capacitance C is much lower than when electrons are stored.

The device and memory array described hereinabove are essentially vertical structures which permit very fast reading of stored information and since no conduction currents are needed (only capacitive coupling is used), power requirements are small. In addition, since only the floating gate needs to be good quality silicon, fabrication problems are minimized. Finally, the vertical structures shown are very compact permitting very high density arrays to be fabricated.

Having thus described my invention, what I claim as new, and desire to secure by Letters Patent is:

1. A memory device capable of assuming two electrical states comprising:

an element of undoped single crystal semiconductor material, a pair of silicon-rich, silicon dioxide layers disposed in insulated spaced relationship with each other disposed on one side of said element, one of said layers being contiguous with said element, means disposed over said pair of layers for applying voltages sufficient to inject carriers into or withdraw carriers from said element and sufficient to interrogate said states of said element, a layer of insulation disposed on the opposite side of said element, and, means responsive to an interrogation signal disposed on said layer of insulation electrically coupled to said element for sensing the motion of carriers in said element said memory device having one value of capacitance in the presence of injected carriers and another value of capacitance in the absence of injected carriers.

2. A memory device capable of assuming two electrical states comprising:
- an element of undoped single crystal semiconductor material,
- a first pair of silicon-rich, silicon dioxide layers disposed on one side of said element, one layer of said first pair being disposed in insulated spaced relationship with the other layer thereof, one layer of said first pair being contiguous with said element,
- means disposed over said first pair of layers for applying voltages sufficient to inject carriers into or withdraw carriers from said element and sufficient to interrogate said states of said element, and
- a second pair of silicon-rich, silicon dioxide layers disposed on the opposite side of said element, one layer of said second pair being disposed in insulating spaced relationship with the other layer thereof disposed on the opposite side of said element, one layer of said second pair being contiguous with said element, and,
- means responsive to an interrogation signal disposed over said second pair of layers electrically coupled to said element for sensing the motion of carriers in said element said memory device having one value of capacitance in the presence of injected carriers and another value of capacitance in the absence of injected carriers.

3. A memory device according to claim 1 wherein said means for applying voltages includes an injection electrode contiguous with the other of said layers and a source of injection voltage coupled to said injection electrode.

4. A memory device according to claim 2 wherein said means for applying voltages includes an injection electrode contiguous with the other layer of said pair of layers and a source of injection voltage coupled to said injection electrode.

* * * * *